US012320596B2

United States Patent
Raman et al.

(10) Patent No.: US 12,320,596 B2
(45) Date of Patent: *Jun. 3, 2025

(54) STRUCTURES FOR RADIATIVE COOLING

(71) Applicant: The Board of Trustees of the Leland Stanford Junior University, Stanford, CA (US)

(72) Inventors: Aaswath Pattabhi Raman, Menlo Park, CA (US); Shanhui Fan, Stanford, CA (US); Eden Rephaeli, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/401,001

(22) Filed: Dec. 29, 2023

(65) Prior Publication Data
US 2024/0210131 A1 Jun. 27, 2024

Related U.S. Application Data

(60) Continuation of application No. 17/856,496, filed on Jul. 1, 2022, now Pat. No. 11,885,576, which is a
(Continued)

(51) Int. Cl.
| | |
|---|---|
| *F28F 13/18* | (2006.01) |
| *B60H 1/00* | (2006.01) |
| *B60H 1/32* | (2006.01) |
| *B64G 1/50* | (2006.01) |
| *F28F 3/02* | (2006.01) |
| *B82Y 20/00* | (2011.01) |

(Continued)

(52) U.S. Cl.
CPC ....... *F28F 13/185* (2013.01); *B60H 1/00328* (2013.01); *B60H 1/32* (2013.01); *B64G 1/50* (2013.01); *B64G 1/503* (2013.01); *F28F 3/02* (2013.01); *B82Y 20/00* (2013.01); *F28F 2013/008* (2013.01); *F28F 2245/06* (2013.01); *G02B 5/28* (2013.01); *H01L 23/36* (2013.01); *H01L 23/473* (2013.01); *H01L 2924/0002* (2013.01)

(58) Field of Classification Search
CPC ...... F28F 13/185; F28F 13/18; F28F 2245/06; G02B 5/28; B82Y 20/00
See application file for complete search history.

(56) References Cited

U.S. PATENT DOCUMENTS 3,310,102 A * 3/1967 Trombe ................ F24F 5/0007
165/133
4,323,619 A * 4/1982 Silvestrini ............... B32B 27/08
62/235.1
(Continued)

*Primary Examiner* — Devon Russell
(74) *Attorney, Agent, or Firm* — Crawford Maunu PLLC

(57) ABSTRACT

Various aspects as described herein are directed to a radiative cooling device and method for cooling an object. As consistent with one or more embodiments, a radiative cooling device includes a solar spectrum reflecting structure configured and arranged to suppress light modes, and a thermally-emissive structure configured and arranged to facilitate thermally-generated electromagnetic emissions from the object and in mid-infrared (IR) wavelengths.

22 Claims, 6 Drawing Sheets

Related U.S. Application Data continuation of application No. 17/195,076, filed on Mar. 8, 2021, now Pat. No. 11,408,689, which is a continuation of application No. 15/652,766, filed on Jul. 18, 2017, now Pat. No. 10,941,990, which is a division of application No. 13/829,997, filed on Mar. 14, 2013, now Pat. No. 9,709,349.

(60) Provisional application No. 61/726,777, filed on Nov. 15, 2012.

(51) Int. Cl.
  *F28F 13/00* (2006.01)
  *G02B 5/28* (2006.01)
  *H01L 23/36* (2006.01)
  *H01L 23/473* (2006.01)

(56) References Cited

U.S. PATENT DOCUMENTS

| | | | | |
|---|---|---|---|---|
| 7,901,870 | B1 * | 3/2011 | Wach | G02B 5/28 |
| | | | | 430/321 |
| 8,861,072 | B2 * | 10/2014 | Arsenault | G02F 1/0128 |
| | | | | 359/359 |
| 2005/0152417 | A1 * | 7/2005 | Lin | H01L 33/20 |
| | | | | 257/E33.068 |
| 2005/0167612 | A1 * | 8/2005 | Jaffer | F25B 23/003 |
| | | | | 250/458.1 |
| 2010/0155043 | A1 * | 6/2010 | Smith | F25B 23/003 |
| | | | | 165/185 |
| 2012/0210736 | A1 * | 8/2012 | Rockenfeller | F25B 49/02 |
| | | | | 62/115 |

* cited by examiner

STRUCTURES FOR RADIATIVE COOLING

Aspects of the present disclosure are directed toward radiant daytime cooling. In certain more specific embodiments, a structure facilitates far-field radiation at particular wavelengths while blocking radiation at solar wavelengths. Additionally, aspects of the present disclosure allow for cooling of buildings and similar structures.

Aspects of the present disclosure utilize radiative cooling techniques that exploit the natural transparency window for electromagnetic waves in the Earth's atmosphere to transport heat from terrestrial objects. These techniques can be used to facilitate passively cooling even at temperatures that are well below the ambient air temperature. Particular aspects are premised upon the recognition that the blackbody spectral radiation wavelengths for common terrestrial temperatures (0-50° C.) are at or near wavelengths where the atmosphere is nearly transparent.

For buildings (and other structures), cooling is a larger issue when the temperature is higher and when the building is exposed to direct sunlight, both of which happen during daytime. Daytime radiative cooling can therefore be significantly more useful than nighttime cooling, but is also often much more challenging due to the problem of absorbed solar radiation.

FIGURES

Various example embodiments may be more completely understood in consideration of the following detailed description in connection with the accompanying drawings.

Figure 1:
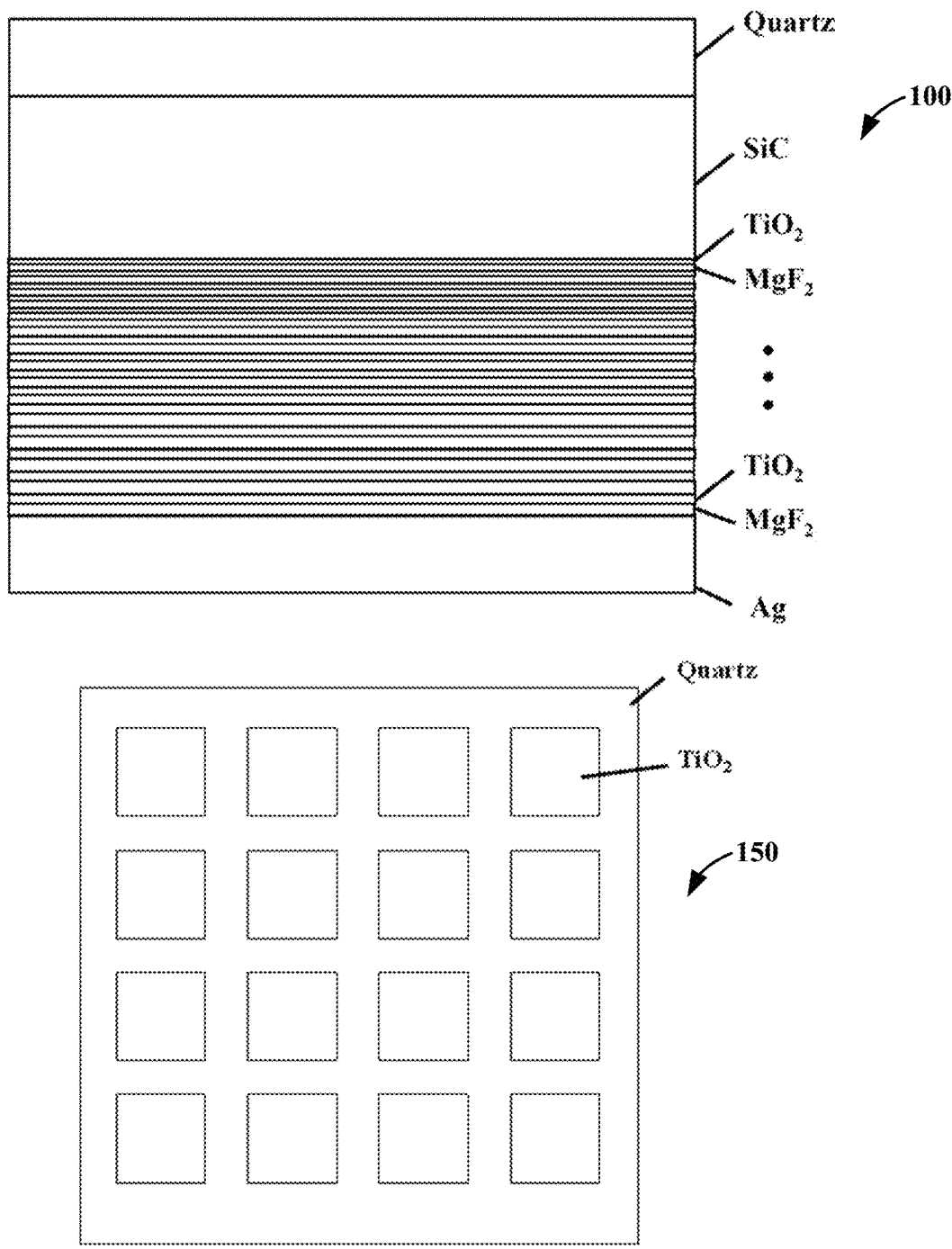
FIG. 1 depicts a radiative cooling device for cooling an object, consistent with embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

DESCRIPTION OF EXAMPLE EMBODIMENTS

Various aspects of the present disclosure are directed towards apparatus, methods of use, and methods of manufacturing of radiative cooling structures.

Certain aspects of the present disclosure are directed towards methods/apparatuses that include a radiative cooling device for cooling an object. A solar spectrum reflecting structure is configured and arranged to suppress light modes within the structure from coupling to sources that are externally located relative to the object being cooled. The particular light modes that are suppressed can be targeted to prohibiting coupling of incoming solar radiation by including at least some wavelengths in the visible, near IR, and ultraviolet spectrum (solar spectrum). A thermally-emissive structure is configured and arranged to facilitate thermally-generated emissions from the object and in mid-infrared (IR) wavelengths. At least a portion of both the solar spectrum reflecting structure and the thermally-emissive structure are integrated into a constitution to both prohibit the coupling of the incoming solar spectrum to the object and facilitate the emission from the object and in mid-IR wavelengths. This type of integration can be particularly useful for a number of different reasons, some of which are discussed in more detail herein.

Radiative cooling can include nighttime cooling, however, such cooling often has a relatively limited practical relevance. For instance, nighttime radiative cooling is often of limited value because nighttime has lower ambient temperatures than daytime, and therefore, there is less of a need for cooling. Accordingly, aspects of the present disclosure are directed toward macroscopically planar photonic structures that selectively enhance mid-IR emission of light, specifically in the atmospheric transparency window, and also suppress absorption of light in the wavelength range of 300 nm-4 μm, i.e., the solar spectral range. Such structures can be useful for a variety of applications including, but not limited to, passively cooling terrestrial structures such as buildings, homes and electronics in the daytime and the nighttime.

In particular embodiments, the structure is macroscopically planar in nature and includes layering and texturing at the nanometer to micrometer scale. For instance, the structure can include materials whose properties are given by a frequency-dependent dielectric constant and are configured to enable sub-wavelength interference and near-field light coupling between constituent layers so as to form spectral regions with a suppressed number of light modes. This suppression can be in the form of photonic band gaps that lead to reduced absorption of solar light. The structure can also include materials, whose properties are given by a frequency-dependent dielectric constant and are configured to enable sub-wavelength interference and near-field light coupling between constituent layers so as to form spectral regions with an enhanced number of light modes. These enhanced light modes can be used to increase the emission of light in the 8-13 μm wavelength range. There are a number of configurations and mechanism for achieving the suppression or enhancement of light modes. A few, non-limiting examples are discussed hereafter.

To enhance the emissivity in the 8-13 μm wavelength range or in the wavelength range supported by a blackbody with temperatures in the range of 250-350° K, a first solution uses a grating or a photonic crystal, to couple surface phonon-polaritons to free-space light modes. This leads to the enhanced emission of light in the 8-13 μm or in the wavelength range supported by a blackbody with temperatures in the range of 250-350° K. The enhanced emission of light is embodied in the emissivity spectrum.

According to another solution, a finite multilayer stack is used that includes two or more materials. The stack is configured to exploit a near-field coupling of light mode, and sub-wavelength interference. This allows for the enhancement of the emission of light in the 8-13 μm wavelength range or in the wavelength range supported by a blackbody with temperatures in the range of 250-350° K. The enhanced emission of light is embodied in the emissivity spectrum.

To suppress absorption in the 300 nm-4 μm wavelength range, one solution uses a multilayer stack consisting of two or more materials, to exploit near-field coupling of light modes, and sub-wavelength interference, to suppress absorption of solar light (300 nm-4 μm). The suppressed absorption of light is embodied in the emissivity/absorption spectrum.

Turning now to the figures, FIG. 1 depicts a radiative cooling device for cooling an object, consistent with embodiments of the present disclosure. The cooling device structure is shown by a side view 100 and also as a top-down view 150. In particular, the metallic (Ag) portion of the structure shown in the side view 100 can be placed in thermal contact with the object being cooled (the contact at least thermally contacting, but also can be physically contacting). The opposite/top portion of the structure (Quartz) can be exposed to sunlight and also to the atmosphere and paths for radiating thermal energy.

An example and experimental embodiment of the structure of FIG. 1 includes (from top to bottom): A quartz grating layer with thickness of 2.5 μm; a SiC grating layer with thickness of 8 μm. Both of these layers can have a periodicity of 6 μm and can have square air rectangles of 5.4 μm width. The top-down view 150 shows a two-dimensional grating structure in this layer, which can be configured and arranged to enhance emissivity that is useful for radiative cooling. For instance, the enhanced emissitivity can be within the range of 8-13 μm where the atmosphere is substantially transparent. This type of grating has been found to be useful for strong emissivity over a broad range of angles of incidence (e.g., 0-80°).

Immediately below the grating layers is a multilayer stack: 3 sets of 5 bilayers (15 layers in total) of varying thicknesses. The first set of 5 bilayers has thicknesses of 25 nm of $TiO_2$ and 35 nm of $MgF_2$, the second set 50 nm of $TiO_2$ and 70 nm of $MgF_2$; the third set of 75 nm of $TiO_2$ and 105 nm $MgF_2$. The multilayer stack is designed to suppress the absorption of solar light throughout the solar spectrum. For instance, these layers can create photonic band gaps that prevent solar light from propagating through the structure.

The particular materials, patterning and thicknesses can be varied and still provide the ability to enhance or suppress the relevant light modes in a single integrated constitution as shown in FIG. 1. The use of a single integrated constitution can be particularly useful for avoiding problems stemming from a solution that might use multiple different components separated by significant physical distances and not integrated into a single constitution. For instance, a reflective covering foil placed over a radiative structure can complicate the total cooling system to the point of severely limiting its versatility of application and durability (e.g., a covering foil might range in thickness from several microns to a fraction of a millimeter, and a compromise between IR transmission and solar reflection may lead to undesirable consequences).

Figure 2:
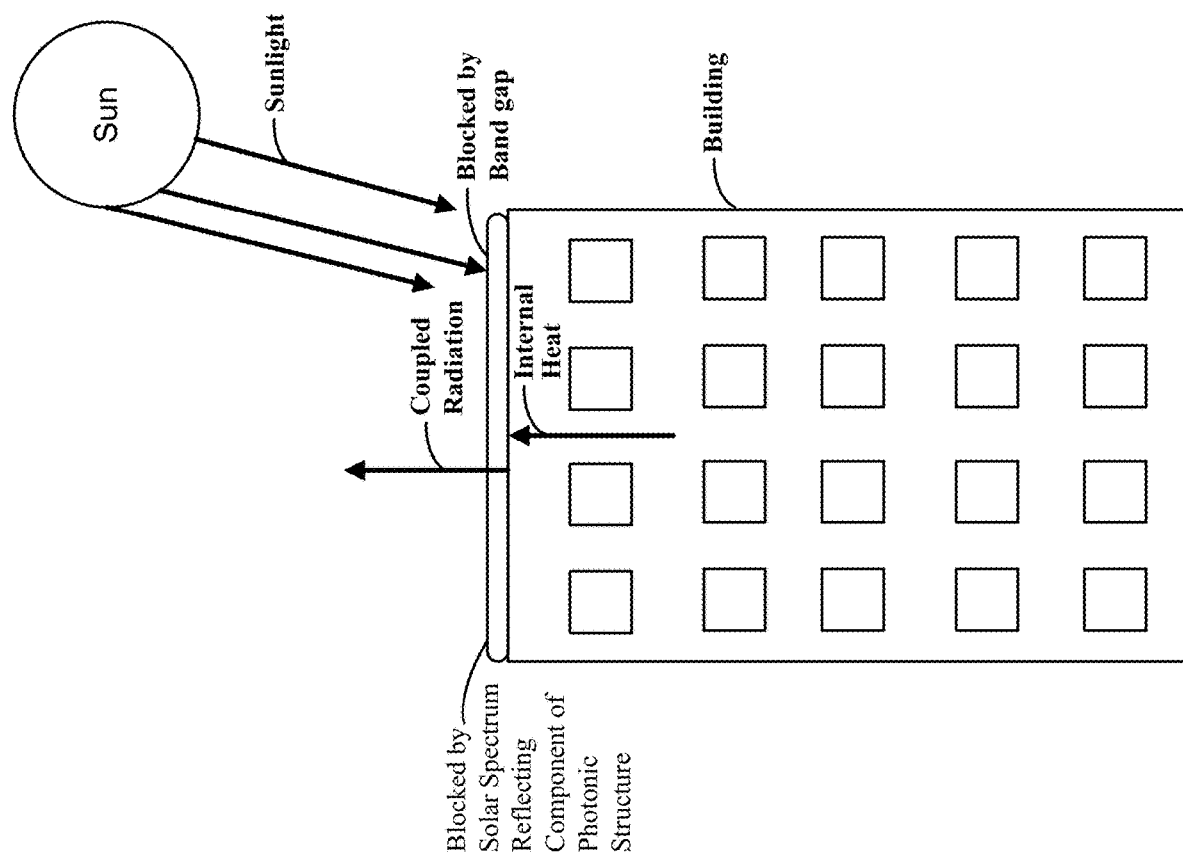
FIG. 2 depicts an example of methods and structures for cooling terrestrial structures such as buildings, automobiles and electronic devices where heat management is an issue, consistent with embodiments of the present disclosure.

FIG. 2 depicts an example of methods and structures for cooling terrestrial structures such as buildings, automobiles and electronic devices where heat management is an issue, consistent with embodiments of the present disclosure. As depicted, various embodiments can provide a passive way of cooling such structures, which can be useful for dramatic energy savings. For instance, experimental testing supports that the performance by the daytime radiative cooler can be at least: $P_{cooling}(T_{ambient})=50$ W=$m^2$ at $T_{ambient}=300°$ K.

In comparison, solar panels that operate at 20% efficiency can generate less than 200 W/$m^2$ at peak capacity. In certain conditions, the passive daytime radiative coolers proposed here could be thought of as solar panel substitutes (or supplements) that reduce the demand on a rooftop solar system by reducing the need for air conditioning (cooling) systems.

Figure 3:
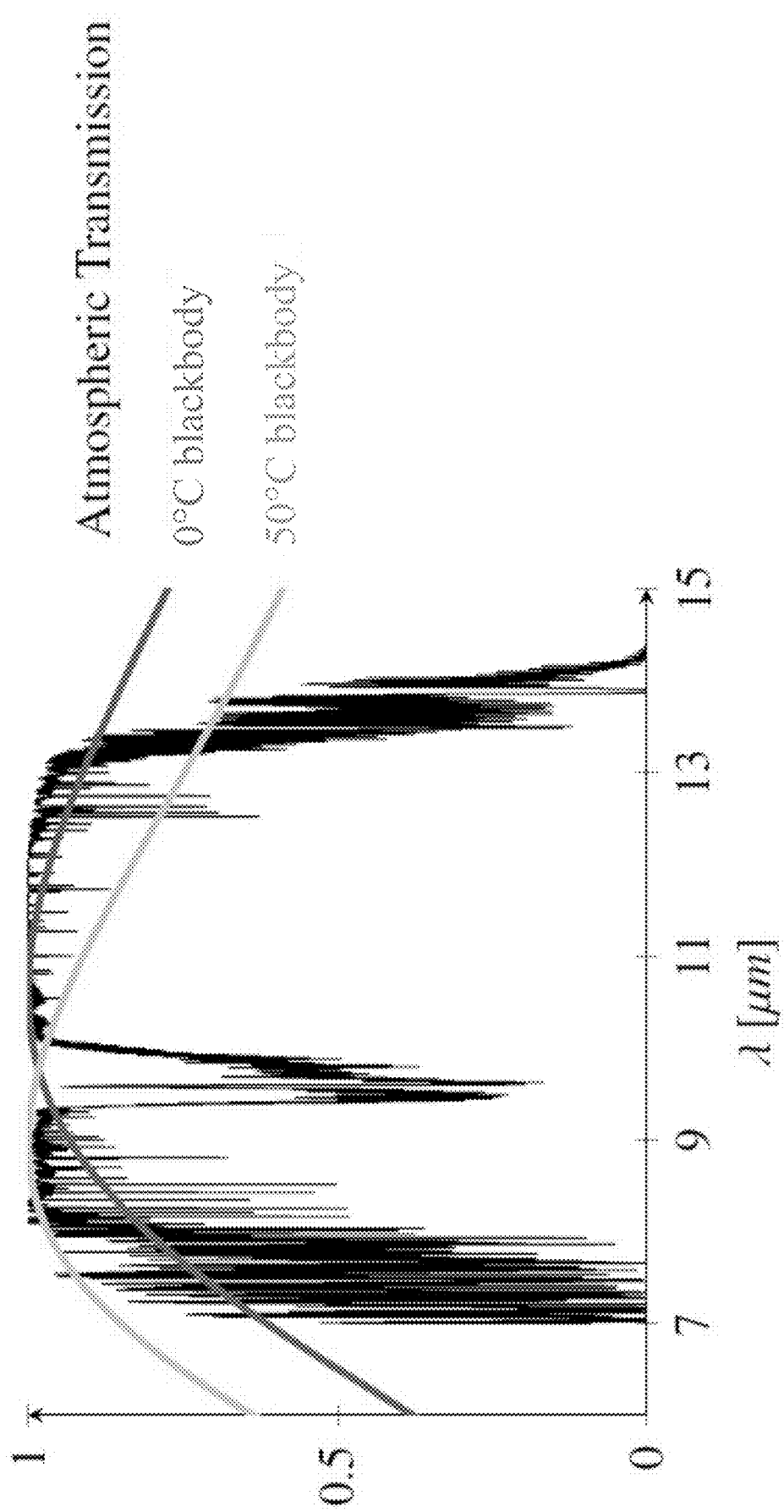
FIG. 3 depicts atmospheric transmission at normal incidence vs. wavelength and normalized blackbody spectral radiance of a 0° C. and a 50° C. blackbody emitter, consistent with embodiments of the present disclosure.
Figure 4:
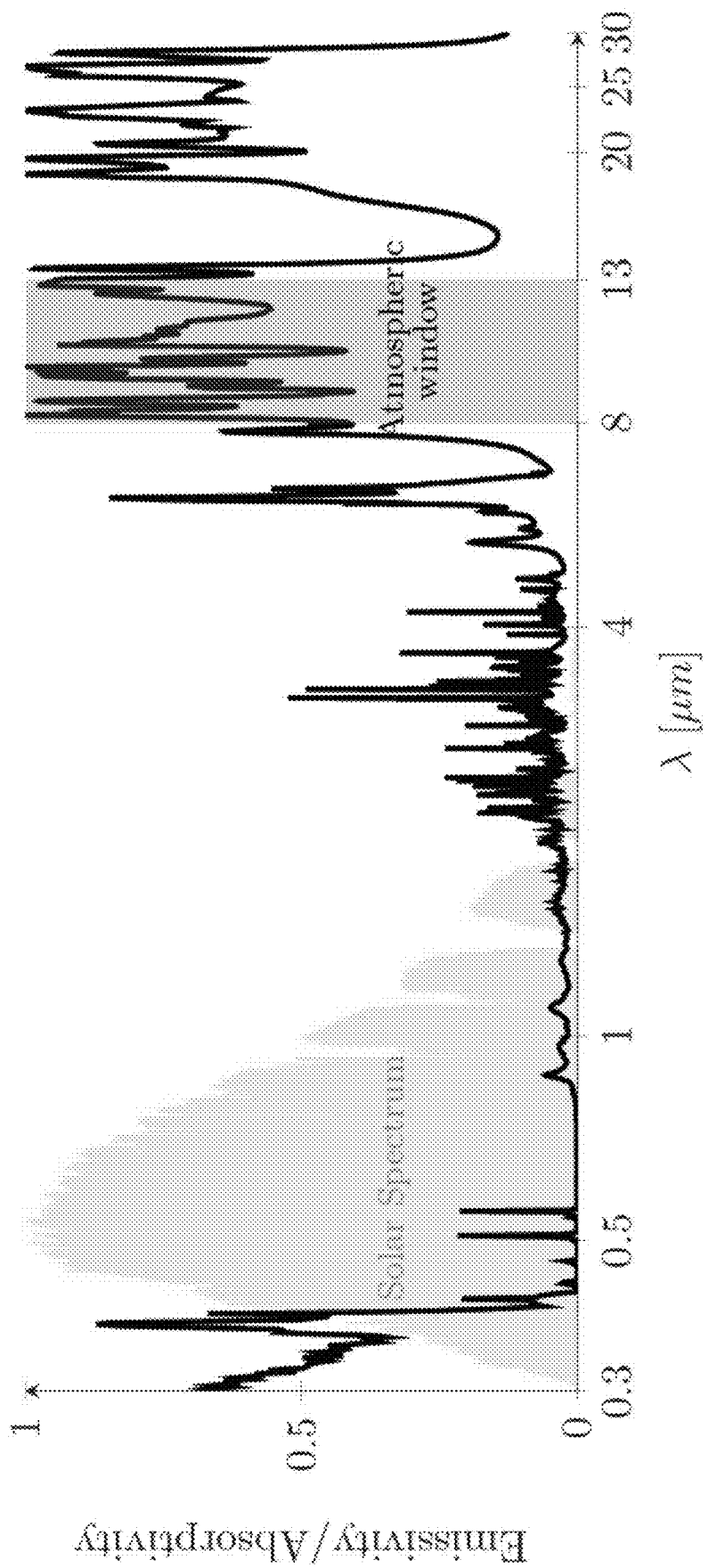
FIG. 4 depicts emissivity of an experimental design for radiative cooler shown at normal incidence, consistent with embodiments of the present disclosure.

FIG. 3 depicts atmospheric transmission at normal incidence vs. wavelength and normalized blackbody spectral radiance of a 0° C. and a 50° C. blackbody emitter, consistent with embodiments of the present disclosure. FIG. 4 depicts emissivity of an experimental design for radiative cooler shown at normal incidence, consistent with embodiments of the present disclosure. FIGS. 3 and 4 suggest that by placing a radiative cooler on rooftops, the buildings could receive significant cooling. As a non-limiting estimate of the building-level energy impact of such a radiative cooler, the effect of a passively cooling rooftop in the daytime on the building's air conditioning needs can be modeled as follows: 1) a peak cooling load of approximately 6 kW (e.g., in Chicago and Orlando) for canonical 2233 ft² one-story homes and 2) the radiative cooler is operating at its peak cooling rate. For 40 m² of daytime radiative cooler on the rooftop (20% of a total of 200 m² available rooftop space), 32% of the house's air conditioning needs can be offset during the hottest hours of the day.

Reducing the air conditioning load at peak hours can be particularly useful for reducing the grid's overall need for dirty 'peak-power' sources that kick in to cover extra power needs in the summer. Moreover, such radiative cooling structures can reduce overall energy demands from commercial buildings such as factories, warehouses and data centers, lending a significant hand to the nation's energy efficiency goals. Air conditioning alone is believed to represent 23% of the power usage of residential and commercial buildings, or 16.33% of the total electric power usage of the United States as of 2011. A 10% reduction in air conditioning needs system wide via thorough implementation of daytime radiative cooling structures would thus represent a 1.6% reduction in the total electric power usage of the country, or 61.7 TWh. This would be equivalent to reducing the need for 7 GW of power generating capacity overall.

Figure 5:
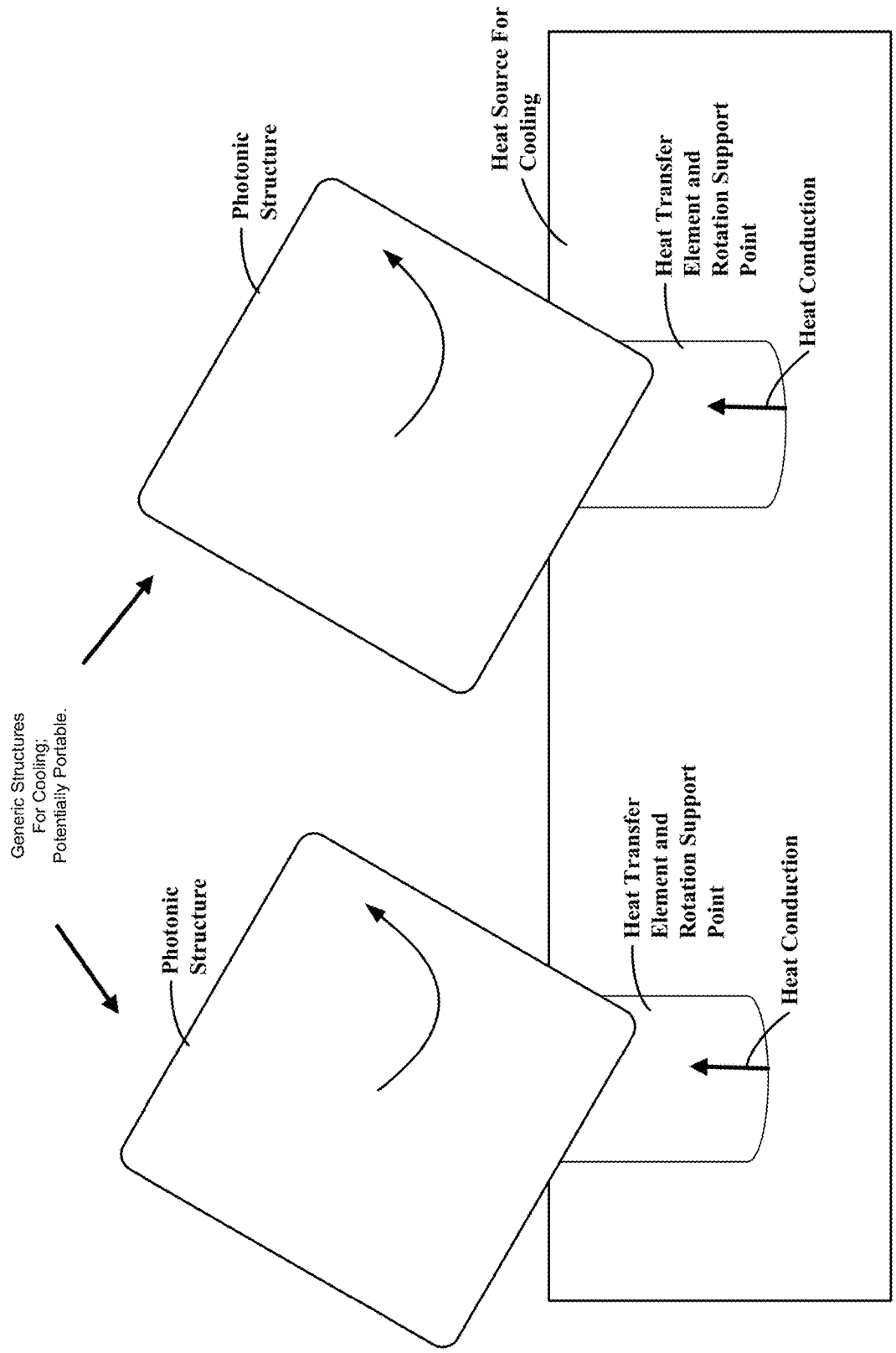
FIG. 5 shows an alternative configuration for providing cooling for various structures, consistent with embodiments of the present disclosure.

FIG. 5 shows an alternative configuration for providing cooling for various structures, consistent with embodiments of the present disclosure. To take advantage of the integrated constitution and associated advantages, the cooling structure can be placed within (or on) a variety of different support structures. One such structure is shown in FIG. 5. This type of support structure can allow the cooling structure to be located above the surface of the object being cooled. This can be particularly useful for situations where the surface of the object is used for other purposes. Consistent with various embodiments, the support structure can be configured for portability so as to allow for simple installation and removal.

Moreover, the support structure could include adjustable elements (e.g., a rotational support portion) that allow the cooling structure to be optimally oriented. In some instances, the orientation could be adjusted for different times of day or even different times of the year. For example, the cooling structure can be uninstalled or oriented to reduce cooling when the ambient temperature is below a threshold value, as may occur during certain times of the year or simply during a cold front. Other possibilities include the use of such structures for cooling of temporary structures (e.g., temporary buildings for large events) or use on mobile structures while motionless and removed during motion (e.g., to avoid damage due to wind shear or objects that might strike the cooling structure during movement).

Accordingly, automobiles represent another area where cooling energy costs can be reduced with a daytime radiative cooler. Although all vehicles could potentially benefit, electric vehicle (EV) battery range could benefit greatly from a reduction of air conditioning needs. It is believed that air-conditioning can reduce an EV's charge depletion range by up to 35%. Experimental modeling suggests that an air conditioning load of 1000 W for small cars could then be reduced 10% by covering 2 m$^2$ of the car's surface.

Another potential application is for extra-terrestrial cooling. In outer space, radiation is the dominant mechanism of heat exchange and temperature regulation. A device operating in space (e.g., orbiting satellite, spaceship or landing probe) which produces heat has the potential to benefit from the use of a radiative cooling structure that would allow it to cool more efficiently and/or obtain a pre-specified equilibrium temperature.

Figure 6:
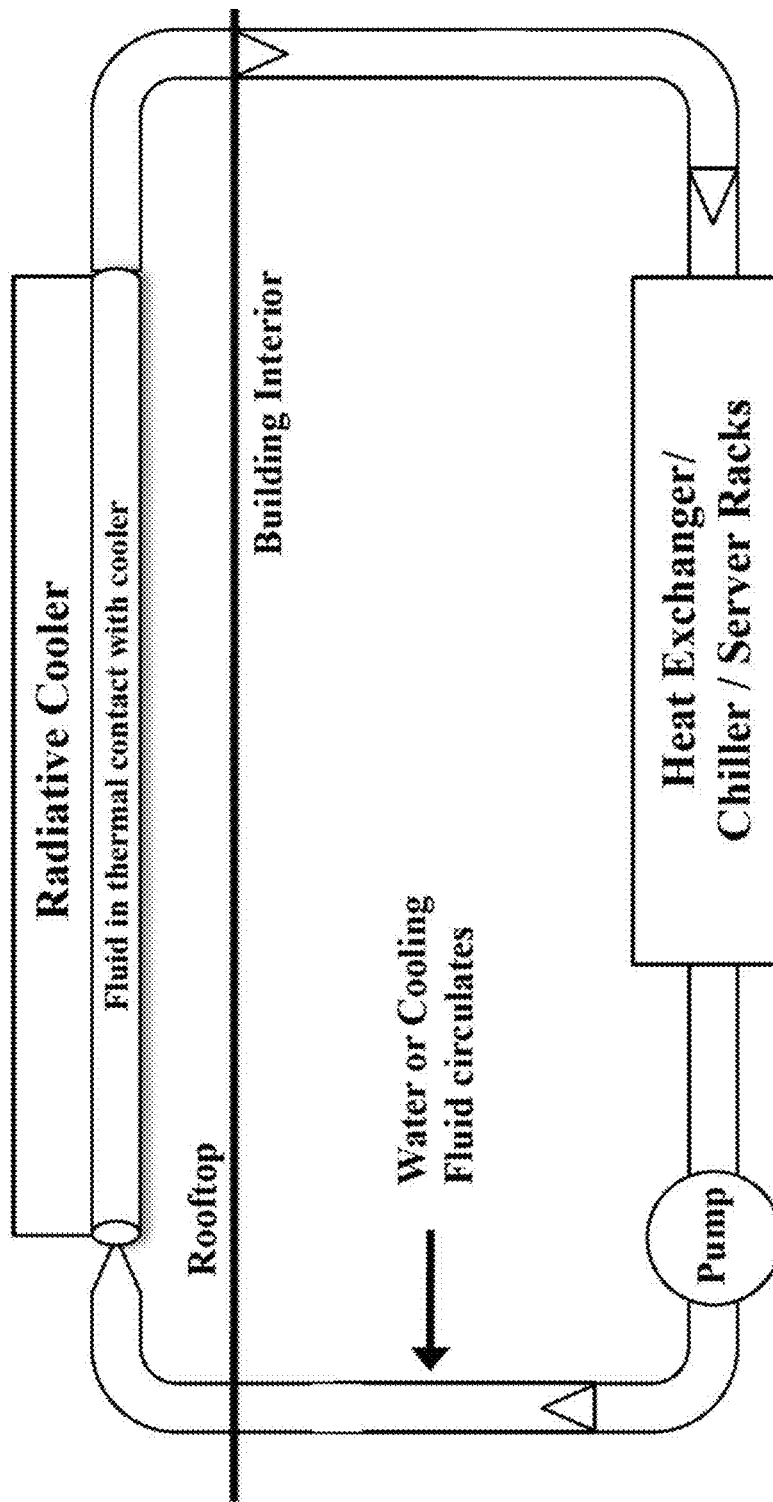
FIG. 6 depicts a cooling system using a heat that cools a building structure and/or internal devices, consistent with embodiments of the present disclosure.

FIG. 6 depicts a cooling system using a heat exchanger that cools a building structure and/or internal devices, consistent with embodiments of the present disclosure. As shown, the building can be cooled using a heat exchange system that conducts/convects heat away from the internals of the building to the roof. For instance, liquid (e.g., water) can be cycled through the system and used to cool the building and/or internal components, such as racks of servers. When the liquid reaches the radiative structure it cools through passive radiation as discussed herein. A heat pump (or similar device) can be used to further increase the cooling capabilities of the system.

Embodiments of the present disclosure are directed toward these and other mechanisms for passively cooling structures even in extremely hot environments. This can be useful for cost and energy savings over the lifetime of buildings and other structures or objects.

Consistent with experimental examples discussed herein, assuming an radiative cooler is operating at its peak cooling rate, then 40 m$^2$ of daytime radiative cooler on the rooftop (20% of a total of 200 m$^2$ available rooftop space), one can offset 32% of a house's air conditioning needs during the hottest hours of the day.

The embodiments and specific applications discussed herein may be implemented in connection with one or more of the above-described aspects, embodiments and implementations, as well as with those shown in the appended figures.

For further details regarding cooling efficiency and energy costs, reference is made to the below-listed documents, which are fully incorporated herein by reference.

A. Burdick, "Strategy guideline: Accurate heating and cooling load calculations," Tech. Rep., U.S. Dept. of Energy: Energy Efficiency and Renewable Energy, 2011.

U. E. I. Administration, "Annual Energy Outlook 2012," Tech. Rep., U.S. Dept. of Energy, 2012.

L. R. J. R. Robb A. Barnitt, Aaron D. Brooker and K. A. Smith, "Analysis of off-board powered thermal preconditioning in electric drive vehicles," Tech. Rep., National Renewable Energy Laboratory, 2010.

R. Farrington and J. Rugh, "Impact of vehicle air-conditioning on fuel economy, tailpipe emissions, and electric vehicle range," Tech. Rep., National Renewable Energy Laboratory, 2000.

T. M. Nilsson and G. A. Niklasson, "Radiative cooling during the day: simulations and experiments on pigmented polyethylene cover foils," Solar Energy Materials and Solar Cells, Vol. 37, No. 1, pp. 93-118, 1995.

S. Catalanotti, V. Cuomo, G. Piro, D. Ruggi, V. Silvestrini, and G. Troise, "The radiative cooling of selective surfaces," Solar Energy, Vol. 17, No. 2, pp. 83-89, 1975.

Various embodiments described above, and shown in the figures may be implemented together and/or in other manners. One or more of the items depicted in the present disclosure can also be implemented in a more separated or integrated manner, or removed and/or rendered as inoperable in certain cases, as is useful in accordance with particular applications. In view of the description herein, those skilled in the art will recognize that many changes may be made thereto without departing from the spirit and scope of the present disclosure.

What is claimed is:

1. A method for cooling a load using an integrated constitution thermally coupled to the load, the method comprising:
    cooling the load below an ambient temperature while the integrated constitution is under sunlight by:
        prohibiting, using the integrated constitution, coupling of incoming electromagnetic radiation over solar wavelengths to the load while the integrated constitution is under sunlight; and
        generating, using the integrated constitution, electromagnetic emissions in mid-IR wavelengths while the integrated constitution is under sunlight.

2. The method of claim 1, wherein the integrated constitution comprises at least two layers.

3. The method of claim 2, wherein the at least two layers comprises:
    at least one layer for prohibiting coupling of incoming electromagnetic radiation to the load while the integrated constitution is under sunlight; and
    at least one other layer for generating electromagnetic emissions in mid-IR wavelengths while the integrated constitution is under sunlight.

4. The method of claim 1, wherein the integrated constitution comprises texturing at a nanometer to micrometer scale.

5. The method of claim 1, wherein prohibiting coupling of incoming electromagnetic radiation over solar wavelengths to the load while the integrated constitution is under sunlight comprises suppressing absorption in a 0.3-4 μm wavelength range.

6. The method of claim 1, wherein generating electromagnetic emissions in mid-IR wavelengths while the integrated constitution is under sunlight comprises generating emissions in a 8-13 μm wavelength range.

7. The method of claim 1, wherein cooling the load below an ambient temperature while the integrated constitution is under sunlight comprises providing radiative cooling exceeding 20 W/m$^2$ at the ambient temperature.

8. The method of claim 1, further comprising thermally coupling the load to the integrated constitution using a heat exchanger.

9. The method of claim 1, wherein the load comprises air inside a building or vehicle, the method further comprising coupling the integrated constitution to a roof of the building or vehicle.

10. An integrated constitution that comprises one or more materials having thermally-emissive properties and that is for cooling a load thermally coupled to the integrated constitution, the integrated constitution to:

prohibit coupling of incoming electromagnetic radiation over solar wavelengths to the load while the integrated constitution is under sunlight; and generate electromagnetic emissions in mid-IR wavelengths, such that the integrated constitution cools the load to below an ambient temperature while the integrated constitution is under sunlight.

11. The integrated constitution of claim 10, wherein the integrated constitution comprises at least two layers.

12. The integrated constitution of claim 11, wherein the at least two layers comprises:
at least one layer for prohibiting coupling of incoming electromagnetic radiation to the load while the integrated constitution is under sunlight; and
at least one other layer for generating electromagnetic emissions in mid-IR wavelengths while the integrated constitution is under sunlight.

13. The integrated constitution of claim 10, wherein the integrated constitution comprises texturing at a nanometer to micrometer scale.

14. The integrated constitution of claim 10, wherein prohibiting coupling of incoming electromagnetic radiation over solar wavelengths to the load while the integrated constitution is under sunlight comprises suppressing absorption in a 0.3-4 μm wavelength range.

15. The integrated constitution of claim 10, wherein generating electromagnetic emissions in mid-IR wavelengths while the integrated constitution is under sunlight comprises generating emissions in a 8-13 μm wavelength range.

16. The integrated constitution of claim 10, wherein cooling the load to below an ambient temperature while the integrated constitution is under sunlight comprises providing radiative cooling exceeding 20 W/m² at the ambient temperature.

17. The integrated constitution of claim 10, wherein the integrated constitution is thermally coupled to the load using a heat exchanger.

18. The integrated constitution of claim 10, wherein the load comprises air inside a building or vehicle, and wherein the integrated constitution is thermally coupled to a roof of the building or vehicle.

19. A system comprising:
a heat exchanger thermally coupled to a thermal load; and
an integrated constitution that comprises one or more materials having thermally-emissive properties and that is thermally coupled to the heat exchanger, the integrated constitution to:
prohibit coupling of incoming electromagnetic radiation over solar wavelengths to the thermal load; and
generate electromagnetic emissions in mid-IR wavelengths while the integrated constitution is under sunlight, wherein the prohibited coupling of incoming electromagnetic radiation and the electromagnetic emissions cause the integrated constitution to cool the thermal load to below an ambient temperature while the integrated constitution is under sunlight.

20. The system of claim 19, wherein the integrated constitution comprises at least two layers.

21. A system for use with a heat exchanger coupled to a thermal load, the system comprising:
an integrated constitution that comprises one or more materials having thermally-emissive properties and that is thermally coupled to the heat exchanger, the integrated constitution to:
generate electromagnetic emissions in mid-IR wavelengths while the integrated constitution is under sunlight and is suppressing absorption of light over solar wavelengths, and
cool the thermal load, in response to suppression of incoming electromagnetic radiation and to the electromagnetic emissions being generated, to below an ambient temperature while the integrated constitution is under sunlight.

22. The system of claim 21, wherein the integrated constitution has multiple layers, among which are a first layer and a second layer, the first layer being different from the second layer in terms of one or more of: thickness, and material composition.

\* \* \* \* \*